US005657486A

United States Patent [19]
Czamara et al.

[11] Patent Number: 5,657,486
[45] Date of Patent: Aug. 12, 1997

[54] AUTOMATIC TEST EQUIPMENT WITH PIPELINED SEQUENCER

[75] Inventors: Allen J. Czamara, Auburn; Romas P. Rudis, Westboro; Ernest P. Walker, Weston, all of Mass.

[73] Assignee: Teradyne, Inc., Boston, Mass.

[21] Appl. No.: 569,020

[22] Filed: Dec. 7, 1995

[51] Int. Cl.[6] ............................................. G06F 9/00
[52] U.S. Cl. ........................ 395/595; 395/596; 395/571
[53] Field of Search ................................ 395/595, 596, 395/571, 800

[56] References Cited

U.S. PATENT DOCUMENTS

| | | | |
|---|---|---|---|
| 4,651,275 | 3/1987 | McDonough | 395/800 |
| 5,058,007 | 10/1991 | Feil | 395/581 |
| 5,159,674 | 10/1992 | Stadlmeier et al. | 395/383 |
| 5,247,624 | 9/1993 | Koumoto et al. | 395/387 |
| 5,524,222 | 6/1996 | Hervin | 395/595 |
| 5,557,772 | 9/1996 | Saka et al. | 395/469 |
| 5,581,778 | 12/1996 | Chin et al. | 395/800 |

*Primary Examiner*—William M. Treat
*Assistant Examiner*—Zarni Maung
*Attorney, Agent, or Firm*—Edmund J. Walsh

[57] ABSTRACT

Automatic test equipment utilizing a pipelined sequencer to retrieve test vectors from a random access memory during execution of a test pattern. The order of execution of the test vectors need not be sequential and can be dynamically altered by conditions measured during execution of a test pattern. Though pipelined, the sequencer provides one vector per cycle, even if the execution order is dynamically altered. The sequencer, because it is pipelined, can be implemented with relatively low cost, though slower speed, components. The disclosed sequencer is implemented with CMOS components.

24 Claims, 5 Drawing Sheets

FIG. 3

| | Prime 1 | | Prime 2 | | Prime 3 | |
|---|---|---|---|---|---|---|
| | JUMP 4 | | NOP-A | | JUMP 7 | |
| | RAM 0 | | RAM 1 | | RAM 2 | RAM 3 |
| | NOP-B | | X | | NOP-C | NOP-E |
| | JUMP-7 | | X | | X | X |
| | NOP-C | | NOP-E | | NOP-F | X |
| | NOP-D | | X | | X | X |
| | NOP-E | | X | | X | X |
| | NOP-F | | X | | X | X |
| | JUMP 13 | | NOP-J | | NOP-K | X |
| | NOP-G | | X | | X | X |
| | NOP-H | | X | | X | X |
| | NOP-I | | X | | X | X |
| | NOP-J | | X | | X | X |
| | NOP-K | | X | | X | X |
| | NOP-L | | X | | X | X |
| | NOP-M | | X | | X | X |
| | ? | | ? | | | |
| | ? | | | | | |

| NUMBR | INSTRUCT |
|---|---|
| 1 | JUMP 4 |
| 2 | NOP-A |
| 3 | NOP-B |
| 4 | JUMP 7 |
| 5 | NOP-C |
| 6 | NOP-D |
| 7 | NOP-E |
| 8 | NOP-F |
| 9 | JUMP 13 |
| 10 | NOP-G |
| 11 | NOP-H |
| 12 | NOP-I |
| 13 | NOP-J |
| 14 | NOP-K |
| 15 | NOP-L |
| 16 | NOP-M |

| ADDR | INSTRUCT | RAM 0 | RAM 1 | RAM 2 | RAM 3 | Global 1 | Global 2 | Global 3 |
|---|---|---|---|---|---|---|---|---|
| 1 | JUMP 4 | GLO 9 | X | NOP-C | NOP-E | JUMP 13 | X | X |
| 2 | NOP-A | JUMP-7 | JUMP 13 | X | X | JUMP 13 | NOP-G | NOP-J |
| 3 | GLO 9 | NOP-C | NOP-E | NOP-G | NOP-J | | | |
| 4 | JUMP 7 | JGLO | X | NOP-F | X | | | |
| 5 | NOP-C | NOP-D | X | X | X | | | |
| 6 | JGLO | NOP-F | X | X | X | | | |
| 7 | NOP-D | JUMP 13 | X | X | X | | | |
| 8 | NOP-F | NOP-G | NOP-J | NOP-K | X | | | |
| 9 | JUMP 13 | NOP-H | X | X | X | | | |
| 10 | NOP-G | NOP-I | X | X | X | | | |
| 11 | NOP-H | NOP-J | X | X | X | | | |
| 12 | NOP-I | NOP-K | X | X | X | | | |
| 13 | NOP-J | NOP-L | X | X | X | | | |
| 14 | NOP-K | NOP-M | X | X | X | | | |
| 15 | NOP-L | ? | ? | X | X | | | |
| 16 | NOP-M | ? | ? | X | X | | | |

FIG. 4

AUTOMATIC TEST EQUIPMENT WITH PIPELINED SEQUENCER

This invention relates generally to automatic test equipment and more specifically to high speed automatic test equipment.

Automatic test equipment (sometimes called a "tester") is often used to test semiconductor components during the manufacturing process. The tester has numerous channels, each one of which generates a signal for a lead of a semiconductor component or measures the response at that lead. By comparing the measured responses from the device under test and comparing them to expected values, the tester determines whether the semiconductor device is operating properly.

The tester operates in cycles or periods. New values are generated or measured at each lead of the device under test each period. The values to be driven or sensed in each channel for one period defines what is sometimes called a "vector."

One vector is executed each period of the test of the device. The collection of vectors used for a test make up a test "pattern." The pattern is stored in memory, much like a conventional computer program.

When testing semiconductor devices in a manufacturing operation, it is highly desirable to test the devices as fast as possible. Long test times reduce the throughput of the manufacturing process and increase the manufacturing cost of each device. As a result, state of the art testers execute vectors at rates of hundreds of megahertz.

An additional requirement of testing semiconductor devices is that there should be no pauses in the execution of vectors. The tester cycles generally correspond to the operating cycle of the device under test. If, during some cycle of tester operation no vector is executed, the outputs of the device under test can not be measured and it will not be possible to determine whether the device has operated properly. Also, during any cycle when no vectors are executed, the inputs to the device under test will be indeterminate. It will thereafter not be possible to tell whether unexpected outputs of the device under test are caused by faults in the device or the inputs during the cycle when no input vector was executed.

The dual requirements of fast execution and no interruption of execution of test vectors are very difficult to satisfy simultaneously. Finding suitable memories to store the test pattern poses a particular problem. The memory used must be able to provide the vectors fast enough to ensure that there is one vector available for execution in each tester cycle.

In a computerized system, such as a tester, there are two timing constraints which dictate whether the memory will be able to provide vectors or instructions fast enough. First, there is the address computation time. This is the time it takes for the system to compute which address in memory stores the next instruction or vector. The second constraint is the memory access time. This is the time it takes the memory, after it receives the address, to provide the vector stored at that address.

In a system which retrieves from memory and executes one vector per cycle, the combined time to compute the address and access the memory must be less than the length of the tester cycle. Unfortunately, random access memories which have fast access times tend to be too small and too expensive to use to store an entire test pattern.

One way that testers have reduced the problem is through the use of sequential access memories (sometimes called "SAM"). With sequential access memory, the access time is very fast as long as the addresses are accessed sequentially.

The effective access time of sequential access memories can be reduced even further by using multiple memories in parallel. Successive vectors are stored in different memories so that multiple values can be retrieved in one access. For example, if there are two memories in parallel, vectors 1, 3, 5, 7, 9 etc. are stored in the first memory; vectors 2, 4, 6, 8, etc. are stored in the second memory. Vectors 1 and 2 are retrieved in one access cycle; vectors 3 and 4 are retrieved in the next access cycle, etc. With this arrangement, each memory is accessed less often and memories with slower access times can be used.

A further enhancement, called "pipelining," has been used with sequential access memories. In pipelining, the pieces of the circuitry used to implement the tester are broken into stages. The stages are separated by registers. At the end of each cycle, the output of each stage is clocked into the register at its output. In the next cycle, each stage takes its input from the register at its input, i.e. the output of the prior stage from the last cycle. For example, the next address for the memory might be calculated in one stage of the pipeline. The memory might be in the next stage of the pipeline. At the start of each cycle, the address is already computed for the memory. Thus, the memory could have an access time almost as long as a cycle and still be able to provide one vector per cycle.

With SAM, the access time increases significantly if vectors are accessed out of the order in which they have been written into memory. Use of SAM requires that the vectors be written into the memory in the order in which they are to be executed. In a tester, in which various measurements are made and different steps are taken based on the measurements, it is sometimes impossible to write the vectors into memory in the order in which they will be executed. Conditional jumps, subroutine calls and traps, such as are often used in programming general purpose computers, are also sometimes used in testers.

To implement these transfer of control features, some random access memory (RAM) is often used in conjunction with SAM. To keep access time and cost low, the RAM is relatively small in comparison to the SAM. Various strategies are used to control the tester to operate with a limited amount of RAM.

In one strategy, the pattern is divided into blocks before it is loaded into SAM. Software, such as a compiler or loader, running on a computer outside the tester divides the pattern into appropriate blocks. Whenever a vector might cause a transfer of control, that vector, along with the vectors to which control might be transferred (sometimes called the "destination"), are included in the same block. The blocks are loaded one at a time into RAM and executed from RAM. Generally, there are multiple RAMs so that one RAM can be reloaded with a new block of vectors while the other is being accessed.

Another strategy is to divide the test pattern into sequential and non sequential vectors. The non sequential vectors are those which either might transfer control to a vector other than the one immediately following it in memory or those to which control is transferred other than from the vector immediately preceding it in memory.

In these strategies, one or more controllers or "sequencers" are used to control whether the next vector to be executed should be retrieved from RAM or SAM. The sequencer also determines the address in that memory for the next vector. The sequencer for SAM can be very simple. It either accesses the next address in SAM or transfers control to the RAM sequencer. It can take advantage of pipelining and other known techniques for SAM.

The sequencer for RAM is more complicated. It must compute the next address in RAM and provide the computed address to the RAM. The sequencer for RAM must contain very fast logic so that the address can be computed with enough time to allow the RAM to access that location in memory during one cycle.

Traditional pipelining can not be used to implement the RAM sequencer in a tester because it will result in pauses in execution of vectors when there is a transfer of control instruction. For pipelining to work without interruption, the next address from memory is computed in a stage before the stage in which the memory is accessed. For vectors which cause a transfer of control, the next memory address to be accessed can often not be determined until that vector is executed. Therefore, the address determined in preceding pipeline might not be correct.

In a traditional pipelined computer system, the possibility of using incorrectly computed address is avoided by a process called "flushing the pipeline." Once a transfer of control instruction is encountered, any addresses already computed at prior pipeline stages are ignored. The memory is not accessed until a new address can be computed after the transfer of control instruction. There is thus a pause while that new address is computed. Such a pause is unacceptable in an automatic test system.

In a commercial system, bipolar technology was used to implement the RAM sequencer. This technology is very fast, allowing the sequencer to perform the many operations needed to determine the next address very quickly. Unfortunately, that technology is expensive and has relatively poor density. Multiple chips are needed to implement all of the functionality.

It would be desirable to make the RAM sequencer with lower cost, higher density technology, such as CMOS. Heretofore, CMOS has not been used because it is too slow.

SUMMARY OF THE INVENTION

With the foregoing background in mind, it is an object of the invention to provide a pipelined computer architecture for apparatus which must execute instructions at a uniform rate without interruption while allowing transfer of control instructions.

It is also an object to provide low cost, high speed memory control circuitry.

The foregoing and other objects are achieved with apparatus storing computer control instructions having an operand portion and a destination portion from which the address of the next instruction to be executed is computed in circumstances dictated by the operand portion and operating state of the apparatus. The destination portion includes information on a plurality of destinations, representing the destination for each of the possible operating states.

In a preferred embodiment, computer control instruction can specify, based on the operating state of the apparatus, at most one of two destinations. The apparatus is implemented with a pipelined address sequencer having a pipeline rank of two. The plurality of destinations stored in the destination portion includes information on up to four possible destinations.

BRIEF DESCRIPTION OF THE DRAWINGS

The invention will be better understood by reference to the following more detailed description and accompanying drawings in which

FIG. 3 illustrates the contents of the random access memories of FIG. 2A or 2B; and FIG. 4 illustrates the contents of random access memories of FIG. 2A or 2B in conjunction with the execution of a transfer of control instruction.

DESCRIPTION OF THE PREFERRED EMBODIMENT

Figure 1:
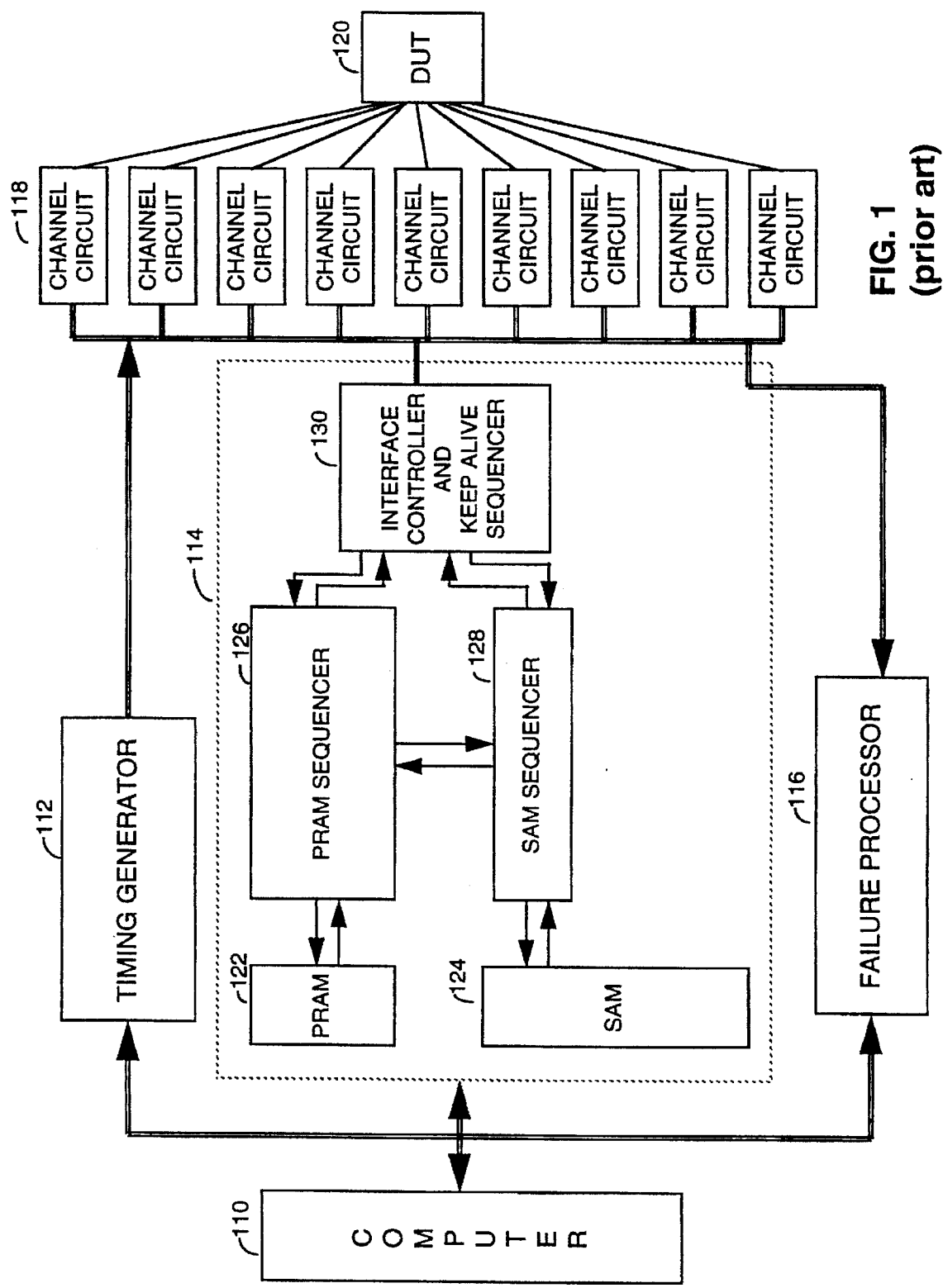
FIG. 1 shows a functional block diagram of prior art automatic test apparatus.

FIG. 1 shows the structure of prior art automatic test equipment (or simply a "tester"). The test equipment is overall controlled by computer 110, which also serves as an interface to a human user or other automated equipment. Computer 110 is connected to timing generator 112, pattern generator 114 and failure processor 116. These elements are in turn connected to channel circuits 118.

Each channel circuit generates or receives a signal for device under test (DUT) 120. In a typical application, DUT 120 is a semiconductor chip, such as a microprocessor, a memory or a modem chip. Normally the chip will be tested as part of the manufacturing process and will be tested while still on a semiconductor wafer on which multiple chips are made.

Timing generator 112 defines periods or cycles of operation of the tester. During each cycle, pattern generator 114 provides data for each channel circuit 118. The data tells such things as whether a value should be generated or measured during that cycle. The pattern data also indicates what value should be generated or is expected to be measured for that channel during the cycle. Other information, such as the format of the data or the time relative to the start of the cycle when that data should occur in the channel might also be included in the pattern data.

Regardless of the exact value of this data, one such set of data will be provided by pattern generator 114 during each cycle.

In cycles in which the data indicates that one of the channel circuits 118 should measure a value from DUT 120, the channel circuit generates a value for failure processor 116. Failure processor 116 stores information about the measured value. It might, for example, store the actual measured value. Alternatively, it might store only that a failure was detected. Failure processor 116 communicates with computer 110, which then reports or processes the results of the test on DUT 120.

The data generated by pattern generator 114 is different for each type of DUT 120. The generated data might also vary depending on the specific test to be performed on DUT 120. For that reason, pattern generator 114 is programmable. It stores a test program or pattern which is generated by a user.

Pattern generator 114 includes two types of memory into which the test pattern is stored. PRAM 122 is random access memory. Any address within PRAM 122 can be accessed with the same access time.

SAM 124 is sequential access memory. The time to access locations in SAM 124 is much shorter when the locations are accessed sequentially. SAM 124 is generally much less expensive than PRAM 122. Therefore, most of the test pattern is stored in SAM 124.

The data generated during each cycle is stored as part of a vector in PRAM 122 or SAM 124. There is one vector executed during each cycle of tester operation. For that reason, the terms "vector" and "cycle" are sometimes used interchangeably.

In addition to storing data, each vector includes control information. The control information specifies what operation, in addition to providing the data to the channel circuits 118, the tester should perform. The control information is referred to as an "instruction." A vector is made up of both data and instructions. The data and instruction portions of a vector are stored in memories sharing a common address space. However, for simplicity, only those memories storing instructions will be shown herein.

The operations specified by an instruction relate generally to transfer of control or branching. For example, an instruction might specify that the next vector to be executed is be the one stored in the next address location. Alternatively, it might specify the address of the next vector to be executed or might specify that the address of the next vector is stored in some other memory in the tester. The portion of the instruction which specifies the address of the next vector is called the "destination" portion of the instruction.

Some instructions are "conditional," meaning that, under some conditions, the next vector to be executed is that one at the address specified by the destination, but when those conditions do not exist, the next vector executed is in the next memory location. As is well known in computer systems, the overall amount of memory needed to store a program can often be reduced through the use of conditional instructions. For example, it is possible to execute the same instructions multiple times without storing them multiple times in memory. The functionality of the computer device can also be greatly increased. For example, it is possible to perform different functions when different conditions are present. Such a capability is particularly important for a tester in which various measurements are made and different steps might be taken based on those measurements.

Vectors which contain transfer of control information are stored mostly in PRAM 122. As described above, vectors in SAM 124 must be executed sequentially in order to provide the required access time. Thus, the only transfer of control instructions that are included in SAM 124 are those that transfer execution to PRAM 122. "Transferring execution to PRAM" means that the next vector executed by the tester is one stored in PRAM 122.

There are two types of instructions which transfer execution to PRAM 122. One type of instruction which transfers execution to PRAM is called a RESUME PRAM instruction. The RESUME PRAM instruction causes SAM sequencer 128 to suspend its operation of retrieving vectors from SAM 124 and causes PRAM sequencer 126 to begin providing vectors from PRAM 122. A similar RESUME SAM instruction can be stored in PRAM 122 to transfer execution to SAM 124.

The first vector provided by PRAM sequencer 126 following a RESUME PRAM instruction is the next vector that would have been executed when execution was transferred to SAM. Likewise, the first vector provided by SAM sequencer 128 following a RESUME SAM instruction is the next vector that would have been executed when control was last transferred to PRAM. In other words, RESUME instructions cause the sequencers to pick up where they left off.

The other instruction which transfers execution to PRAM is a subroutine call. In a subroutine call, the destination portion of the instruction specifies an address in PRAM 122.

In addition, upon the occurrence of a subroutine call, information about the next vector that was to be provided by PRAM sequencer 126 is retained in a stack (not shown), similar to a stack used in a conventional computer.

A different instruction in PRAM 122, called a subroutine RETURN instruction, can cause execution of vectors to resume with the next vector in SAM 124, the same as a RESUME SAM instruction. A RETURN instruction differs from a RESUME SAM instruction in that the RETURN requires that the information stored in the stack to be taken off the stack and used to determine the next vectors to be executed.

In some embodiments, the subroutine stack includes a field which indicates whether, upon execution of a return instruction, execution should resume in SAM or should resume in PRAM. When this field is used, it is set based on a parameter in the CALL instruction.

Subroutine call instructions can also be stored in PRAM 122. In addition, other instructions which transfer control can also be stored in PRAM 122. A JUMP instruction, much like a jump instruction used in a conventional computer can be stored in PRAM 122. The JUMP instruction includes a destination address within PRAM 122 containing the next vector. The JUMP instruction might also specify various conditions under which the jump should or should not be taken.

Another type of instruction which alters the order of execution of vectors in PRAM 122 is called a global instruction. A global instruction is similar to a subroutine call in that it transfers execution to a different address in PRAM 122. However, the destination address in PRAM 122 is not contained within the global instruction. Rather, the destination address is stored in registers within PRAM sequencer 126. Some vectors perform operations which change the values stored in these registers. A global instruction is used, for example, when an error is detected.

The concept of a "trap" is closely related. A trap is similar to a global instruction in that when it occurs the address of the next vector executed is obtained from registers within PRAM sequencer 126. The address of that vector is stored in a trap register, which is set by other vectors. However, a trap does not occur from execution of a vector. Instead, it occurs when hardware within the tester detects that a specified condition has occurred.

SAM sequencer 128 generates the addresses to SAM 124. Because instructions are, in most cases, executed sequentially from SAM 124, SAM sequencer 128 is generally a pipelined CMOS component. It generates addresses sequentially until it detects a subroutine call or a RESUME PRAM instruction. When one of these instructions is encountered, SAM sequencer 128 stops generating addresses for SAM 124 and sends an indication to PRAM sequencer 126 that execution is to begin from PRAM 122.

PRAM sequencer 126 generates the addresses for PRAM 122. It must start execution at the appropriate address when control is transferred from SAM sequencer 128. It also must fetch vectors from the appropriate addresses when there are transfer of control instructions executed from PRAM 122. Those transfer of control instructions might be jump instructions, subroutine calls, global instructions or similar instructions. PRAM sequencer 126 must also handle trap instructions.

Interface control circuit 130 is connected to both SAM sequencer 128 and PRAM sequencer 126. Regardless of the source of the data, it is provided through interface controller 130 to channel circuits 118. Interface controller 130 also executes a "keep alive" function. Sometimes in a tester, it is necessary to pause execution of a test while portions of the tester are set up for some aspect of the test. Typically, "keep alive" is used when PRAM 122 or SAM 124 is reloaded with data from computer 110. Because inputs to DUT 120 must be provided to avoid placing DUT 120 in an indeterminate state, the keep alive function provides to channel circuits 118 a set of values which will not change the state of DUT 120.

Figure 2A:
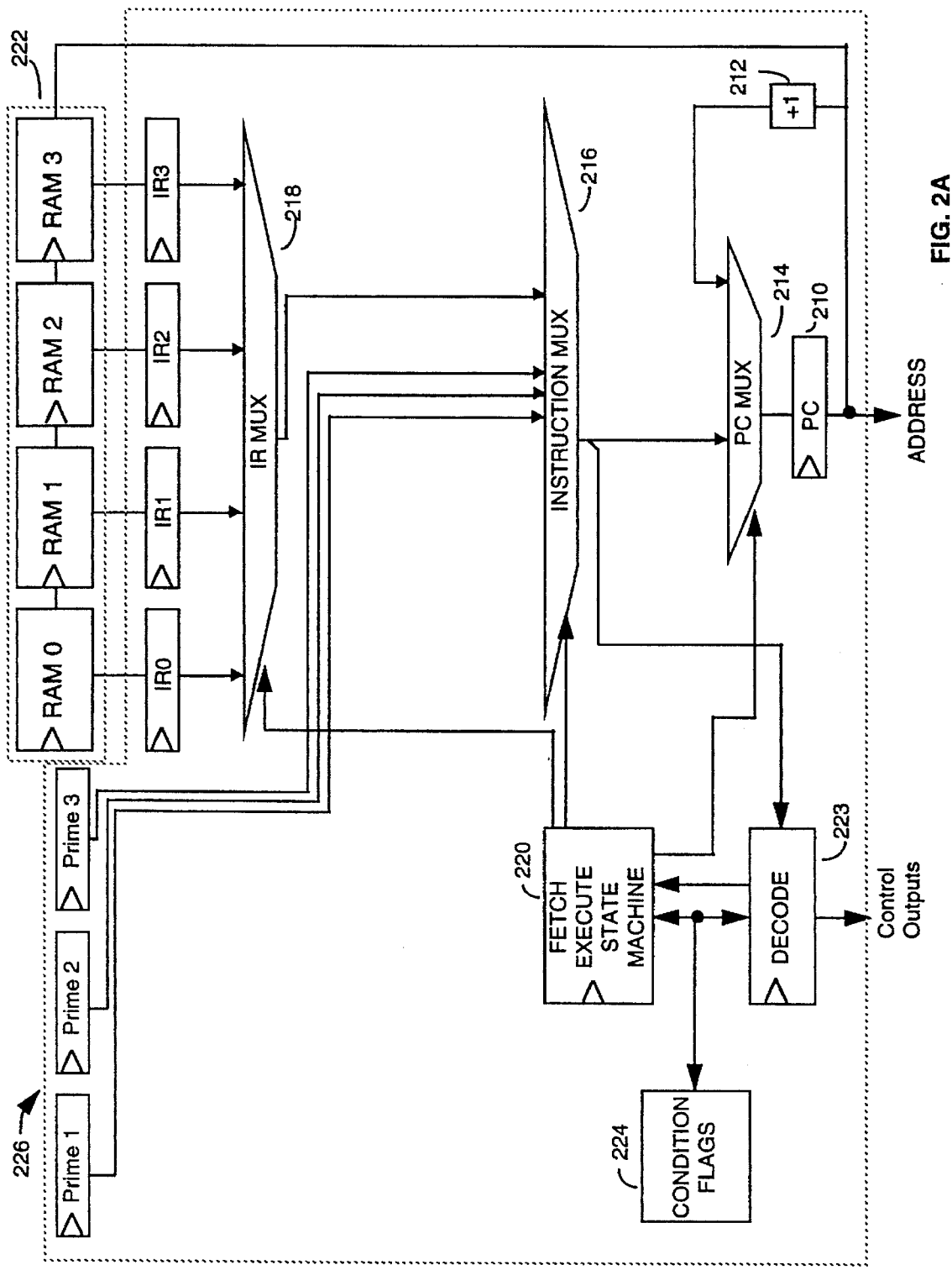
FIG. 2A shows a simplified schematic diagram of a pipelined sequencer according to the invention.

The invention is useful in a tester with the same architecture as shown in FIG. 1, though it might be used with testers of many other architectures. However, the prior art tester in FIG. 1 uses expensive circuitry to implement PRAM sequencer 126. FIG. 2A shows a design for a PRAM sequencer 226 which allows that element to be implemented with relatively low cost CMOS components. FIG. 2A shows a simplified version of a sequencer which does not include circuitry to implement subroutines, traps or global instructions.

PRAM sequencer 226 works in conjunction with PRAM 222. PRAM 222 is a memory which can output several vectors at the same time. In the preferred embodiment, PRAM 222 is made from four separate RAM chips, RAM 0, RAM 1, RAM 2 and RAM 3, arranged in parallel. Each of the RAM chips stores test vectors. The test vectors placed in each of the RAM chips RAM 0 to RAM 3 are the set of instructions which the tester might need to execute at a future clock cycle.

In the preferred embodiment, that clock cycle is two clock cycles into the future. This number of clock cycles is selected because PRAM sequencer 226 is pipelined with two pipeline stages. In other words, it takes two cycles from the generation of an address until the vector stored at that address can be accessed from memory and executed.

In the preferred embodiment, there are four memories RAM 0 to RAM 3 because there are four possible choices for the instruction which might be executed two clock cycles after the current instruction. This point might be best understood by reference to FIG. 3.

FIG. 3 shows a pattern of instructions. For simplicity, each instruction is a JUMP type instruction or a NOP type instruction. A JUMP type instruction is any instruction which will cause execution to go another address when certain conditions are met. For purposes of illustration, those conditions are not important, but are generally the same conditions as are found in the prior art. A NOP instruction is one in which there is no possibility of a jump. The next instruction executed after a NOP is the one stored after it in memory (unless a TRAP condition is satisfied or some other external factor alters the operation of the sequencer).

Both the NOP and JUMP type instructions have data associated with them which indicates the values which are provided to channel circuits 118 when the instruction is executed. For simplicity, that data is not shown, but it is like the data stored in conjunction with prior art testers.

The first column in FIG. 3 lists numbers for each vector. The numbers are sequential based on the order in which the vectors were programmed. Because the vectors are stored in RAM and include transfer of control instructions, the vectors are not necessarily executed in that order.

The second column gives the control information for the vector. The control information in conjunction with conditions measured during a test indicate the order in which the vectors will be executed.

FIG. 3 shows the contents of RAM 0 through RAM 3 adjacent to the list of vectors. In a traditional architecture, each vector is mapped to one address in a memory and that vector is stored at that address in the memory. Here, each vector is mapped to an address in each of the memories RAM 0 . . . RAM 3. However, rather than storing the instruction at that location, an instruction which might be executed in a future clock cycle is stored at that address.

The location in RAM 0 stores the vector which will be executed two clock cycles in the future if no jumps occur. Thus, the first location stores the third vector; the second location stores the fourth vector; etc. The fifteenth and sixteenth locations would store the seventeenth and eighteenth vectors, respectively. Those vectors are not shown in FIG. 3 and those locations are then indicated with a question mark. The memory in a tester would, however, would have data stored in as many locations as are needed to represent an entire test pattern. In the example of FIG. 3, the first location in RAM 0 stores NOP-B, which corresponds to vector 3.

The location in RAM 1 stores the vector which will be executed two clock cycles in the future if no JUMP is taken at the current instruction but a jump is taken at the next instruction. FIG. 3 shows that the first instruction is a JUMP. If no jump is taken, the next vector will be number 2, which is NOP-A. There is no possibility of a jump as the result of the execution of a NOP instruction. Thus, there is no need to enter data in the first location of RAM 1.

However, the third location in RAM 1 contains a vector. This vector is the same as vector 7. It is derived by assuming that there is no jump when the third vector is executed. If no jump occurs, the next vector will be vector 4. Vector 4 is a JUMP 7 instruction. If that jump is taken, the next vector will be number 7. Therefore, the third location in RAM 1 stores vector 7, which is NOP-E.

The location in RAM 2 stores the vector which will be executed two clock cycles in the future if the current instruction causes a jump and there is no jump at the next instruction. In the example of FIG. 3, the first instruction is JUMP 4. If that jump is taken, the second vector executed will be number 4. That instruction is JUMP 7. However, if the jump is not taken, the next instruction will be number 5. That vector is NOP-C. Thus, NOP-C is stored in the first location of RAM 2.

The locations in RAM 3 store the vector which will be executed two clock cycles in the future if the current instruction causes a jump to an instruction which also causes a jump. In the example of FIG. 3, the first instruction is JUMP 4. If that jump is taken, the next vector executed will be vector 4, which contains JUMP 7. If that jump is taken, the next instruction will be vector 7, which is NOP-E. That value is stored in the first location of RAM 3.

The four values stored at the same addresses in RAM 0 through RAM 3 represent all the possibilities for vectors to be executed two cycles after the corresponding vector is executed. Having this future instruction data available makes it possible for PRAM sequencer 226 to be pipelined.

Returning to FIG. 2A, register 210 holds the address of a vector currently being executed. This value is termed the PC. It is used to address PRAM 222. It is also provided to the memory which holds the data values. Thus, when one vector is being executed, PRAM 222 is being provided with an address causing PRAM 222 to output the four possible instructions it could be executing two cycles into the future. Those values are latched at the outputs of RAM 0 . . . RAM 3.

In the next clock cycle, those values are clocked into registers IR0 through IR3. At that time, one of the registers IR0 to IR3 contains the vector that is to be executed in the next clock cycle. The appropriate one of the vectors is selected by IR MUX 218.

The control input to IR MUX 218 is provided by fetch execute state machine 220. Fetch execute state machine 220 changes its state as each instruction executes based on whether the instruction executed causes a transfer of control.

To choose among the four values in registers IR0 to IR3, the state machine needs to track four states, corresponding to the four choices stored in IR0 to IR3. When the last two instructions did not cause any transfer of control, then fetch execute state machine outputs values to IR MUX 218 which cause the MUX to select the value in IR0. When the prior instruction caused a transfer of control but the second to last instruction did not, then state machine 220 outputs values which cause MUX 218 to select register IR1. When the prior instruction did not cause a transfer of control but the second to last one did, then state machine 220 outputs values to select IR2. When the last two instructions cause transfer of control, then state machine 220 outputs values causing MUX 218 to select IR3. In this way, the appropriate next instruction is passed through IR MUX 218.

Fetch execute state machine 220 is implemented using conventional digital logic. It receives inputs from decoder 223. As in a conventional computer system, decoder 223 receives the instruction to be executed and generates control signals. Decoder 224 is connected to condition flags 224.

As in a conventional tester, condition flags are set or cleared as measurements are made by the tester. The state of the condition flags is used to determine whether a particular JUMP instruction should cause a transfer of control. For example, a JUMP instruction might be conditioned on the first flag being set. When the instruction is executed, decoder 223 checks whether the first flag is set. If it is, decoder 223 indicates that the jump should be taken. Otherwise, decoder 223 indicates that no transfer of control should be taken.

FIG. 2A shows that decoder 223 is connected to state machine 220. Thus, decoder 223 provides to state machine 220 the information needed to select among the values in registers IR0 to IR3.

The selected instruction is passed through IR MUX 218 to instruction MUX 216. Instruction MUX 216 is included to account for the possibility that the instruction might come from some place other than PRAM 222. Such a possibility is discussed in greater detail in conjunction with FIG. 2B. In the simplified diagram of FIG. 2A, the selected instruction passes through instruction MUX 216 for further processing.

The output of instruction MUX 216 is split. One portion goes to PC MUX 214. The other portion goes to decode 223. Instructions contain a portion which describe the operation the instruction should cause. Instructions also include a portion which is used to specify the destination address in the event the instruction causes a transfer of control. For example, FIG. 3 shows that the first instruction is JUMP 4. The JUMP portion of the instruction specifies the operation. The number 4 is the destination address. Returning to FIG. 2A, the operation portion of the instruction is passed to decoder 223. The destination portion is passed to PC MUX 214.

When the operation portion of the instruction indicates that the instruction should cause a transfer of control, as indicated above, decoder 223 provides a signal to state machine 220. State machine 220, in addition to generating control signals to IR MUX 218, generates control signals for PC MUX 214. When there is to be a transfer of control to a destination specified in the selected instruction, state machine 220 generates control signals to PC MUX 214 which pass the destination portion of the selected instruction through to PC register 210. Thus, in the next cycle, PC register 210 contains the destination address as the address of the vector to be executed.

On the other hand, when the instruction does not require a transfer of control, the destination portion of the next address is not contained in the instruction. In general, the next address will be one higher than the current address stored in PC register 210. To generate this address, adder 212 adds one to the current value in PC register 210. The output of adder 212 is also an input to PC MUX 214. Thus, PC MUX 214 selects between a destination address specified in an instruction or the next address.

Thus, two clock cycles after an instruction is accessed in PRAM 222 it is used to determine the next address in PC register 210 and is also used to determine operation of the tester. It will be appreciated that parallel circuitry is required to retrieve the data portion of the vectors and send that data to the rest of the tester. That circuitry is not shown for simplicity.

The foregoing description of the operation of PRAM sequencer 226 applies when the current address has already been loaded into PC register 210. However, the value in PC register 210 at any given clock cycle is determined from the instructions fetched from PRAM 222 two clock cycles earlier. When a test pattern first starts to execute, there are no instructions which have been fetched earlier. Thus, operation during the first two cycles of a test pattern is different.

In particular, the instructions to be executed during the first two cycles of a test pattern are not selected from registers IR1 to IR3. Rather, they are selected from registers prime 1 to prime 3.

FIG. 3 shows that the values in registers prime 1 through prime 3 are determined from the test pattern. The first instruction in the test pattern is loaded into register prime 1. The second instruction, if there is no transfer of control when the first instruction is executed, is loaded into register prime 2. The second instruction to be executed if there is a transfer of control when the first instruction executes is stored in register prime 3. Loading of registers is handled, as in the prior art, by commands sent from computer 110 (FIG. 1), which controls the tester.

Thus, before the test pattern is executed, the address of the first instruction is loaded into PC register 210. Fetch execute state machine generates control values to instruction MUX 216 to select the output of register PRIME 1.

The instruction in register PRIME 1 is executed. If that instruction causes a transfer of control, state machine 220 generates control signals for instruction MUX 216 which select the value in PRIME 3 as the next instruction. IF there is no transfer of control, then the control signals select the value in PRIME 2 as the next instruction. By that time, values accessed from PRAM 222 during the first cycle are already loaded into registers IR0 to IR3. Operation proceeds as described above.

Thus, in addition to the four states described above which distinguish among the four choices in registers IR0 to IR3, state machine 220 has two start-up states to distinguish between the values in registers PRIME 2 and PRIME 3.

Figure 2B:
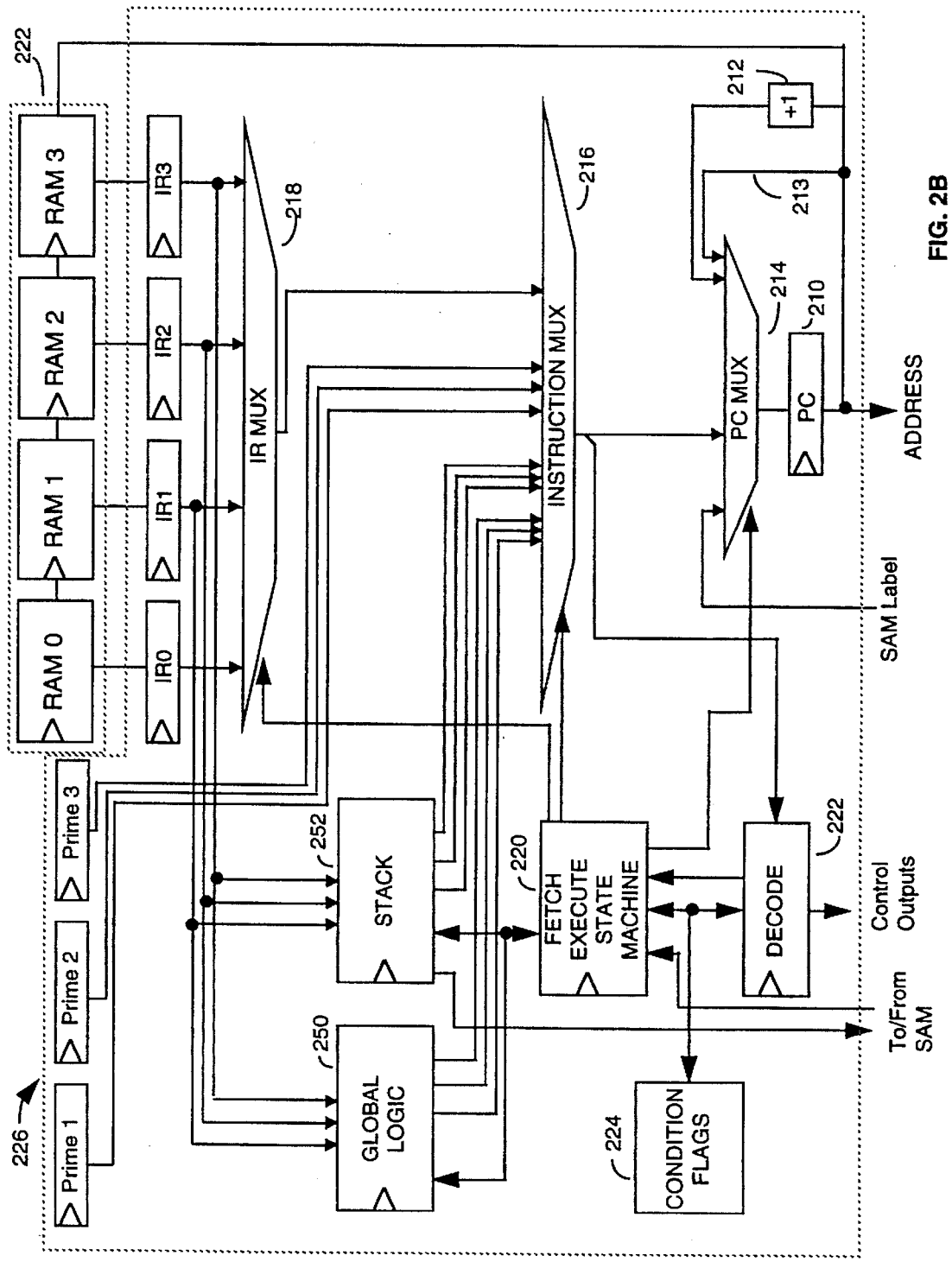
FIG. 2B shows an expanded schematic diagram of a pipelined sequencer according to the invention.

FIG. 2A shows a basic form of PRAM sequencer 226 in which vectors stored in PRAM 222 are executed. Those vectors cause either a jump to another instruction or the next instruction in sequence is executed. FIG. 2B shows an expanded version of PRAM sequencer 226 which allows greater flexibility in operation of the tester.

One possible enhancement is that the same instruction might be repeated. To allow for this possibility, the output of PC register 210 is looped back to an input of PC MUX 214 through path 213. When an instruction is to be repeated, state machine 220 controls PC MUX to 214 to pass through the value in PC register 210 as the next value in PC register 210. Thus, the address of the instruction to be executed does not change.

Another possibility is that an instruction in PRAM 222 causes a jump to a preset global address. Such an instruction is indicated by JGLO. The preset address is stored in a register called the global register (not shown). The global register might be loaded before a test by software executing on computer 110 (FIG. 1). Alternatively, the global register might be loaded by executing a vector which has an operand part indicating that the global register should be loaded and a destination part indicating the address to load into that register. Such an instruction is indicated by GLO.

With the invention, however, it is not sufficient to store merely the next instruction in the global register. It is necessary to also store the choices for the following instruction. There are two such choices: one corresponding to the instruction following the destination if there is a jump to global and one corresponding to the destination of the instruction if that instruction transfers control.

FIG. 2B shows global logic 250, which stores and provides the required information when a JGLO instruction is executed. Global logic contains a set of three registers which are very similar to registers prime 1 to prime 3. Those registers could be loaded from computer 110 in the same way that registers prime 1 through prime 3 are loaded. However, in the preferred embodiment, the registers within global logic 250 are loaded from information in PRAM 222. This method of loading allows the global address to be changed during execution of the test pattern.

FIG. 4 illustrates how this information can be obtained. FIG. 4 again shows the vectors in a test pattern. The third vector in the test pattern has a GLO 9 instruction. This instruction indicates that, upon execution of a JGLO instruction, execution should branch to instruction 9.

The GLO instruction does not cause a transfer of control. For an ordinary instruction which does not cause a transfer of control, there is no need to store information in the RAM 2 and RAM 3 locations corresponding to that instruction because that information is used only when the associated instruction causes a transfer of control. However, when the test pattern is broken up and written into PRAM 222, the GLO instruction is treated as if it could cause a transfer of control. Thus, the information stored in locations 410 and 412 is not for use when the GLO instruction is executed. Rather, that information is used when the JGLO instruction is executed. When the GLO instruction is executed, that information is transferred into the registers in global logic 250.

Location 410 stores the instruction to be executed two cycles after the JGLO instruction is encountered if the first instruction executed after the JGLO does not cause a branch. This register is shown as GLOBAL 2 in FIG. 4. Location 412 stores the instruction to be executed two cycles after the JGLO instruction is encountered if the first instruction executed after the JGLO does cause a branch. This register is shown as GLOBAL 3 in FIG. 4.

At the time the GLO instruction is executed, the information in locations 410 and 412 is being addressed in PRAM 222. It is not clocked into registers IR2 and IR3 until two clock cycles later. Thus, state machine 220 includes circuitry to clock the contents of registers IR2 and IR3 into two of the three registers in global logic 250.

Locations 410 and 412 do not contain all the information which must be stored in global logic 250. In particular, they do not store the first instruction to be executed after the JGLO instruction is encountered. This information is stored in one of the RAM 0 ... RAM 3 locations associated with the instruction which is executed before GLO instruction. Depending on the execution order of vectors, it will either be in a RAM 1 or RAM 3 location. For the example shown in FIG. 4, that is location 414, which is in RAM 1.

At the time the GLO instruction is executed, if execution proceeded from vector 2 to vector 3, (i.e. execution proceeded sequentially to the GLO instruction), the information in location 414 will have been clocked into register IR 1. Thus, when the GLO instruction is executed, if execution proceeded sequentially to the GLO instruction, the value in register IR 1 is clocked into register Global 1 in global logic 250.

If execution did not proceed sequentially to the GLO instruction, then the desired value for register Global 1 will not be in register IR 1. Rather the desired information would be in register IR 3. To ensure the appropriate data is in IR 1 or IR 3, when the values to be loaded into RAM 0 ... RAM 3 are determined, values are loaded into PRAM 222 as if the GLO instruction will cause a transfer of control to its destination address. However, when the GLO instruction is executed, these values are not loaded into PC 210 to actually cause the transfer of control at that time. They are loaded into global registers in GLOBAL LOGIC 250 to be read out when the JGLO instruction is eventually executed and causes the transfer of control.

As described above, state machine 220 tracks whether there was a jump to an instruction or whether an instruction was arrived at sequentially. This information is normally used to determine the correct control inputs to IR MUX 218. However, the same information can be used upon execution of a GLO instruction to determine whether information from register IR1 or IR3 should be loaded into register GLOBAL 1.

When the JGLO instruction is executed, state machine 220 generates control information for instruction MUX 216 to select the value from register GLOBAL 1. If that instruction causes a branch, state machine 220 will, in the next clock cycle, generate control inputs to instruction MUX 216 to select the value in register GLOBAL 3. Conversely, if that instruction does not cause a branch, state machine 220 will generate control information to select the value in register GLOBAL 2 for the next instruction.

During the first and second cycles following a JGLO instruction, the information in registers IR0 to IR3 is not used because it is incorrect. Thereafter, the information is correct and execution of the test pattern proceeds as described in conjunction with FIG. 2A.

A similar sequence of events occurs when a trap rather than a global instruction is executed. In that case, trap logic (not shown) operating the same as the global logic would be used. A SET TRAP instruction would operate just like a GLO instruction and three values would be stored in registers in the trap logic.

A similar situation also occurs when a subroutine is executed. The CALL subroutine command can be treated just like a JUMP instruction discussed above. The instructions to be executed can therefore be determined in advance and stored in PRAM 222. However, upon the return from a subroutine, the instructions to be executed will depend on the instruction being executed when the subroutine was called.

As in a conventional computer, the return address is stored in a stack. Each time a CALL instruction is encountered, information about which instructions to execute when a return is encountered is also pushed on the stack. When the return instruction is executed, those instructions are "popped" from the stack and used.

With the invention, stack 252 is "three wide." That means that, for each CALL instruction executed, three instructions are stored on the stack. One instruction indicates the first instruction to execute upon return from the subroutine. The next indicates the second instruction to execute if the first instruction is sequential (not a branch). The remaining instruction is the second instruction to execute if the first instruction is a branch. These are stored in locations STACK 1, STACK 2 and STACK 3, respectively.

The first instruction to be executed after a return from a subroutine CALL is the same as the instruction which would be executed after the CALL instruction if the CALL instruction did not cause a transfer of control. This will be one of the four choices stored in PRAM 222 associated with the instruction executed before the CALL. In particular, the RAM 2 location associated with the instruction executed before the CALL if the instruction before the CALL caused a jump to the CALL. If the prior instruction did not cause a jump, then the appropriate information is stored in the RAM 0 location associated with the prior instruction.

Therefore, the information for STACK 1 is the information being read out of RAM 0 or RAM 2 when the CALL instruction is executed. It is thus the information stored in either register IR0 or IR2 in the clock cycle following the cycle in which the CALL instruction is executed. In particular, if the execution of instructions arrived at the CALL instruction sequentially, then the required information is in IR0. If the execution of instructions arrived at the CALL instruction following an instruction which caused transfer of control, then the required information is stored in IR2. State machine 220 generates the command to store that information into the stack registers.

The second instruction to be executed following the return from the call will be the same as the choices for the instruction to be executed if the CALL instruction had not caused a transfer of control. Thus, it will be one of the instructions stored in either RAM 0 or RAM 1 locations associated with the CALL instruction. Because it can not be determined until the vector pattern is executed whether the instruction to be executed two cycles after the RETURN is the one in RAM 0 or RAM 1, both are stored. The value in RAM 0, which is in IR0 two cycles after the call, is stored in STACK 2. The value in RAM 1, which is in IR1 two cycles after the CALL, is stored in STACK 3. As described above, state machine 220 generates the appropriate control signals to cause the transfer.

Each subroutine CALL instruction adds new values to STACK 1, STACK 2 and STACK 3 at the top of the stack. This operation is analogous to pushing a single value on a stack in an ordinary computer. Upon execution of a RETURN from subroutine instruction, the values at the top of the stack are used to determine the next instruction to execute.

Upon execution of a RETURN from a subroutine instruction, the value in STACK 1 at the top of the stack is loaded in PC register 214. State machine 220 generates the appropriate control signals to PC MUX 214 to pass the required value to PC register 214. In the next clock cycle, either the value in STACK 2 or STACK 3. State machine 220 determines, based on whether the prior instruction caused a branch, which one of these values is used.

The foregoing description of subroutine CALL and RETURN assumed that the subroutine CALL was executed as a PRAM instruction. If a CALL instruction is executed from SAM 124, the information about the next two instructions to be executed are not stored in SAM 124 the same way that they are stored in PRAM 222.

To ensure that no interruption in execution occurs when there is a subroutine call from SAM, each CALL instruct takes up four memory locations. The first location contains the coding for the CALL instruction itself and the destination of the call within PRAM.

The next three locations in SAM contain priming information similar to what is stored in prime registers PRIME 1, PRIME 2 and PROME 3. However, because the priming information is different for each subroutine call, that information is stored with the call.

The second of the four locations in SAM storing the CALL instruction stores the first instruction to be executed as part of the subroutine. The next two locations in SAM store the two choices for the second instruction executed as part of the subroutine. One stores the instruction to be executed if the frist instruction does not cause a transfer of control. The other stores thee instruction to be executed if the first location causes a transfer of control.

The first and second instructions executed as part of the subroutine are actually executed by decoder 223 PRAM sequencer 226. Thus, upon execution of a CALL PRAM instruction by SAM sequencer 128, the destination portion of the CALL instruction is passed to PRAM sequencer 226 along with the information stored in the next three locations in SAM. FIG. 2B shows that destination portion passing to PC MUX 214. The data path for the information read from the other three SAM locations is not explicitly shown. However, it will be appreciated that the information will pass through instruction MUX 216 in the same way as the three values from stack 252, global logic 250 or the prime registers.

In order to ensure that the required data is available to instruction MUX 216 at the appropriate time, it is necessary that all four addresses storing the CALL PRAM instruction be read within two cycles of operation of PRAM sequencer 226. One embodiment which makes this possible is the use of "double wide" or "by two" SAM. This simply means that in normal operation, two addresses are always read from SAM during each memory access. Normally, the values are used one at a time, but when the information is to be passed to PRAM sequencer 226, both could be passed simultaneously.

Another feature which allows four values to be read in two cycles is that SAM is dynamic memory and must be refreshed. Normally, SAM is operated so that memory access cycles are interleaved with refresh cycles. In cases where there is a CALL PRAM instruction, though, a refresh cycle is skipped. In this way, four instructions are read from memory in two cycles.

Execution of a CALL PRAM instruction also requires storing the state of the PRAM sequencer. At the time a CALL is executed from SAM, one of the registers IR0 . . . IR3 contains the value for the first instruction to be executed when execution in PRAM resumes. The values latched at the outputs of RAM 0 . . . RAM 3 contain the second instruction to be executed upon a RESUME in PRAM. These values must be stored in STACK 252 to ensure proper operation when a RESUME PRAM instruction is executed.

Thus, when state machine 220 detects that a CALL from SAM is going to be executed in two cycles, in addition to the operations described above, it sends control signals to stack 252 to store in the STACK 1 register at the top of the stack one of the values from IR0 ... IR3. The value selected is the one that would have been executed when a RESUME instruction was encountered.

In the next cycle, in addition to the operations described above, two values then stored in IR0 ... IR3 must be selected for storage in the STACK 2 and STACK 3 registers. If the last instruction executed before execution was suspended in PRAM caused a transfer of control, then the contents of IR2 and IR3 will be loaded into registers STACK 2 and STACK 3, respectively. If the last instruction executed did not cause a transfer of control then the contents of IR0 and IR1 will be loaded into registers STACK 2 and STACK 3, respectively.

Therefore, when the RESUME PRAM instruction is next executed, the first instruction executed will be in STACK 1. The next instruction will be selected from STACK 2 or STACK 3, depending on whether the first instruction caused a transfer of control, as described above.

Additionally, a flag is set inside state machine 220 or some other mechanism is used to indicate that the values to be used upon a RESUME PRAM instruction have been stored on the stack. This flag has two effects. When a RESUME PRAM instruction is encountered, it causes the first two instructions to be used from STACK 252. In addition, if another CALL from SAM is executed before the next RESUME PRAM instruction is executed, it suppresses the storing of additional information on stack 252 because stack 252 already stores the information required upon execution of a RESUME PRAM instruction.

The foregoing describes operation of PRAM sequencer 226 in most instances. There are, however, some special cases created by the use of a pipelined sequencer. In particular, it should be noted that there are a set of instructions which cause instructions to be pushed onto stack 252 or stored in separate registers, such as GLOBAL 1 ... GLOBAL 3. Examples of these instructions discussed above are CALL and GLO. Because of the pipelined operation of sequencer 226, it requires two cycles for these instructions to be fully pushed onto stack 252 or stored in the registers. There are also a set of instructions which require instructions to be read off, or "popped" from, stack 252 or read from the registers GLOBAL 1 ... GLOBAL 3. Examples of these instructions discussed above are RETURN and JGLO. For simplicity, only the case of information pushed and pop onto stack 252 will be considered, but similar steps are taken in relation to storing and retrieving instructions in registers GLOBAL 1 ... GLOBAL 3.

If there is not at least two cycles between the execution of an instruction which requires information to be pushed onto the stack and an instruction which requires information to be popped off of the stack, the normal operation described above will not work. Thus, stack 252 has feed through paths (not shown).

If an instruction requiring information be popped from the stack is executed right after an instruction which pushes data onto the stack, no information is pushed onto the stack. Rather, the information which would have been routed to register STACK 1 during the push operation is routed straight through to register PC 210. In the next cycle, the information which would have been stored in STACK 2 and STACK 3 is routed to instruction MUX 216. The control input to instruction MUX 216 is set to select the appropriate value based on whether the prior instruction caused a transfer of control and that value is passed through to register PC 210.

Having described one embodiment, numerous alternative embodiments or variations might be made. For example, a set of instructions which might be executed by automatic test equipment was described. Other instructions that might be executed. For example, instructions to cause a PUSH or POP from stack 252, similar to those used in a conventional computer might be included. In addition, various operations might be included in a single instruction. For example, a subroutine RETURN might be combined with a RESUME SAM instruction.

As another example, the invention might be employed as a sequencer for PRAM 222 without having any sequential memory, such as SAM 124.

Also, it was described that multiple memory chips were used to implement PRAM 222. It is not necessary that RAM 0 ... RAM 3 actually be in separate memory chips. An equivalent structure can be obtained by using any number of memory chips, as long as there are the required number of separate fields in the memories. Another possible variation in the memory architecture is that prime registers prime 1 . . . PRIME 3 do not need to be separate registers. Some locations in PRAM 222 could be allocated for this purpose.

Further, it was described that registers IR0 ... IR 3 were separate from PRAM 222. The function of those registers might be incorporated in PRAM 222, which would be the case if a synchronous SRAM were used, or the registers might be incorporated into other elements. The same variation might be made with any of the registers.

Therefore, the invention should be limited only by the spirit and scope of the appended claims.

What is claimed is:

1. Computer apparatus of the type executing instructions during cycles of operation and having instruction memory storing a plurality of instructions, each instruction stored at an associated address in the memory and at least a portion of the instructions controlling the order in which the instructions stored in memory are executed by the computer apparatus, comprising:

a) a memory structure having a plurality of fields, each storing an instruction, corresponding to each of a plurality of addresses, the memory structure having an address input and a data output;

b) a sequencer having address outputs coupled to the address inputs of the memory structure and an instruction input coupled to the data output of the memory structure, the sequencer comprising means for selecting, during a first cycle, among the plurality of fields corresponding to a first address based on at least one instruction executed during a prior cycle and executing the selected instruction wherein said sequencer comprises:

multiplexing circuitry having a data output, a control input and a plurality of data inputs, the data inputs coupled to the memory structure such that an instruction in each field is coupled to a data input of the multiplexer;

means for executing instructions at the output of the multiplexing circuitry;

state machine circuitry coupled to the means for executing instructions including means for tracking, during each cycle, the order of execution of instructions in a predetermined number of prior cycles and generating a control signal based on whether the instructions executed in prior cycles altered the order of execution of instructions, the control signal being coupled to the control input of the multiplexing circuitry.

2. The computer appartus of claim 1 wherein the sequencer is pipelined such that there are a predetermined number of cycles between the time when a address is applied to the memory structure and an instruction corresponding to that address is executed.

3. The computer apparatus of claim 2 wherein the predetermined number of cycles is expressed as N and the plurality of fields is $2^N$ fields.

4. The computer apparatus of claim 3 wherein the number of cycles is two and the plurality of fields is four fields.

5. The computer apparatus of claim 2 wherein series of instructions, including those which control the order of execution of instructions, are executed in consecutive cycles without interruption.

6. The computer apparatus of claim 1 additionally comprising a plurality of data storage locations, and wherein the multiplexing circuitry comprises additional data inputs coupled to the data storage locations.

7. The computer apparatus of claim 6 wherein the data storage locations represent a portion of a stack.

8. The apparatus of claim 7 additionally comprising means for selectively routing data retrieved from the memory structure to the plurality of data storage locations upon execution of a predetermined instruction controlling the order in which the instructions stored in memory are executed.

9. Computer apparatus of claim 1, wherein said apparatus is incorporated into an automatic test equipment of the type executing a test pattern comprising instructions to test a semiconductor circuit.

10. The automatic test equipment of claim 9 wherein a set of data values is applied to the semiconductor circuit in accordance with the content of the instructions during each of a plurality of successive cycles.

11. A method of operating a computerized apparatus executing computer instructions, each instruction having operand and destination information specifying whether the address in memory of the next instruction follows the address at which that instruction is stored or is at a non-sequential address, the computer apparatus having control circuitry and state circuitry, the computer apparatus executing instructions in successive cycles by performing an operation based on the operand in an instruction and determining the address of the next instruction to be executed based on operating conditions of the computerized apparatus at the time the instruction is executed and the destination information in the instruction, the method comprising the steps of:
  a) precomputing, for each instruction in the series, possible destinations which could result in a cycle a predetermined number of cycles following the execution of the instruction;
  b) storing for each instruction the instructions at the precomputed possible destinations;
  c) retrieving during a first cycle the stored instructions corresponding to precomputed destinations for a first instruction;
  d) in a later cycle, selecting one of the retrieved stored instructions based on whether previously executed instructions caused execution of instructions from sequential or non-sequential addresses;
  e) executing the selected instruction and repeating steps c) and d) by retrieving instructions associated with the execution of the selected instruction.

12. The method of claim 11 wherein the predetermined cycle is two cycles following the execution of the instruction.

13. The method of claim 11 additionally comprising the execution of subroutine call instructions according to the steps of:
  a) upon execution of a subroutine call instruction, transferring to a first storage location one of the instructions retrieved in a prior cycle;
  b) in the cycle following the execution of the subroutine call instruction, transferring to a second and third storage locations instructions retrieved when the subroutine call was executed.

14. The method of claim 13 wherein the first, second and third storage locations comprise locations which form a record on a stack.

15. The method of claim 13 additionally comprising the execution of subroutine return instructions according to the steps of:
  a) upon execution of a subroutine return instruction, retrieving and executing the instruction stored in the first storage location and retrieving the stored instructions corresponding to that instruction;
  b) in a following cycle, selecting between the instructions stored in the second and third locations based on whether execution of the instruction stored in the first location indicated sequential or non-sequential exeuction.

16. The method of claim 11 additionally comprising the steps of:
  a) initially storing at least three instructions in a first location, a second location and a third location;
  b) at the start of the execution of a series of instructions, executing the instruction stored in the first location and using this instruction as the first instruction; and
  c) in the following cycle executing an instruction in the second when execution of the instruction in the first location resulted in sequential execution and executing the instruction in the third location when execution of the instruction in the first location resulted in non-sequential execution.

17. Automatic test equipment incorporating computer apparatus to execute, in each cycle of operation of the automatice test equipment, instructions stored at successive addresses in memory, with certain instructions altering the order in which the instructions are executed, comprising:
  a) instruction memory having a plurality of fields sharing a common address space;
  b) a first multiplexer having a plurality of data inputs, a control input and a data output;
  c) a plurality of registers connected between the memory and the data inputs of the first multiplexer;
  d) an instruction decoder, having an input coupled to the data output of the first multiplexer, producing an output signal indicating whether the instruction applied to the decoder has altered the execution order of the instructions; and
  e) a state machine coupled to the output of the instruction decoder having a set of states corresponding to whether instructions executed in at least one preceding cycle caused non-sequential execution of the instructions, the state machine having output lines coupled to the control input of the first multiplexer, the state machine producing a different value on the output lines for each state in the set of states.

18. The automatic test equipment of claim 17 wherein the plurality of fields in the instruction memory comprises at least four fields.

19. The automatic test equipment of claim 17 additionally comprising a clock and the registers, the instruction memory and the instruction decoder and state machine are clocked by the clock.

20. The automatic test equipment of claim 17 additionally comprising:
   a) a second multiplexer connected between the first multiplexer and the instruction decoder, the second multiplexer having a plurality of data inputs, one of which is connected to the data output of the first multiplexer, and a control input connected to the state machine, the second multiplexer also having a data output connected to the instruction decoder; and
   b) a plurality of registers, each connected to one of the data inputs of the second multiplexer.

21. The automatic test equipment of claim 20 wherein the plurality of registers comprise priming registers.

22. The automatic test equipment of claim 20 wherein the plurality of registers comprise a portion of a stack.

23. The automatic test equipment of claim 20 wherein the plurality of registers comprise global registers.

24. The automatic test equipment apparatus of claim 17 wherein the instruction memory comprises random access memory and additionally comprising:
   a) sequential access memory having inputs which receive addresses for the sequential access memory and data outputs;
   b) a sequencer coupled to the inputs of the sequential access memory generating addresses for the sequential access memory; and
   c) means for selectively coupling the data outputs of the sequential access memory to the instruction decoder.

* * * * *